United States Patent
Ying et al.

(10) Patent No.: US 7,000,687 B2
(45) Date of Patent: Feb. 21, 2006

(54) HEAT DISSIPATING DEVICE

(75) Inventors: Guo-Liang Ying, Shenzhen (CN);
Ai-Min Huang, Shenzhen (CN);
Shu-Ho Lin, Tu-Cheng (TW)

(73) Assignee: Hon Hai Precision Industry Co., Ltd., (TW)

(*) Notice: Subject to any disclaimer, the term of this patent is extended or adjusted under 35 U.S.C. 154(b) by 0 days.

(21) Appl. No.: 10/893,214

(22) Filed: Jul. 16, 2004

(65) Prior Publication Data
US 2005/0247437 A1    Nov. 10, 2005

(30) Foreign Application Priority Data
Apr. 22, 2004    (CN) .......................... 200420045284

(51) Int. Cl.
*F28D 15/00* (2006.01)
(52) U.S. Cl. .......................... 165/104.33; 165/104.21; 165/80.4; 361/700; 361/704; 257/715; 174/15.2
(58) Field of Classification Search .......... 165/104.21, 165/104.26, 104.33, 185, 80.4; 361/697, 361/699, 700; 257/714–716; 174/15.2
See application file for complete search history.

(56) References Cited

U.S. PATENT DOCUMENTS

| 6,102,110 | A  | * | 8/2000  | Julien et al. ........... 165/104.33 |
| 6,189,601 | B1 | * | 2/2001  | Goodman et al. ......... 165/80.3 |
| 6,450,250 | B1 |   | 9/2002  | Guerrero |
| 6,542,364 | B1 | * | 4/2003  | Lai et al. .................... 361/697 |
| 6,651,734 | B1 | * | 11/2003 | Liu ........................... 165/80.3 |
| 6,779,595 | B1 | * | 8/2004  | Chiang ................... 165/104.33 |
| 6,796,373 | B1 | * | 9/2004  | Li ........................... 165/104.21 |
| 6,808,013 | B1 | * | 10/2004 | Lai et al. .................... 165/80.4 |
| 6,827,136 | B1 | * | 12/2004 | Liu ........................ 165/104.33 |
| 6,830,098 | B1 | * | 12/2004 | Todd et al. ............. 165/104.33 |
| 6,915,844 | B1 | * | 7/2005  | Chou .................... 165/104.33 |
| 2003/0019610 | A1 | * | 1/2003 | Liu ........................... 165/80.3 |
| 2003/0141041 | A1 | * | 7/2003 | Chen ......................... 165/80.3 |
| 2004/0035558 | A1 | * | 2/2004 | Todd et al. ............. 165/104.26 |
| 2004/0050534 | A1 | * | 3/2004 | Malone et al. ............. 165/80.3 |

FOREIGN PATENT DOCUMENTS

| CN | 02287462.3 | 12/2003 |
| TW | 514488     | 12/2002 |
| TW | 532747     | 5/2003  |

* cited by examiner

*Primary Examiner*—Terrell Mckinnon
(74) *Attorney, Agent, or Firm*—Morris Manning & Martin; Tim Tingkang Xia, Esq.

(57) ABSTRACT

A heat dissipating device (1) for removing heat from electronic devices is disclosed. The heat dissipating device includes a heat sink (30) and at least one heat pipe (20). The heat sink includes a Y-shaped heat conductive body and a plurality of fins (35) extending from the body. The body includes a solid block (32) and two extension arms (34) extending aslant from a top of the block in opposite directions. An U-shaped groove (35) is defined in the block and extends to an upper portion (33) of the block. The heat pipe comprises an evaporating portion (22) and a condensing portion (24) extending upwardly from the evaporating portion. The heat pipe is received in the groove so that the heat pipe absorbs heat via the evaporating portion and transfers the heat to the upper portion of the block via the condensing portion thereof.

19 Claims, 4 Drawing Sheets

HEAT DISSIPATING DEVICE

TECHNICAL FIELD

The present invention relates generally to heat dissipating devices for removing heat from heat-generating devices, and more particularly to a heat dissipating device having high heat dissipation efficiency thereof for cooling electronic devices such as Central Processing Units (CPUs).

BACKGROUND

Computer electronic devices such as central processing units (CPUs) generate lots of heat during normal operation. If not properly removed, such heat can adversely affect the operational stability of computers. Solutions must be taken to efficiently remove the heat from the CPUs. Typically, a heat sink is mounted on a CPU to remove heat therefrom.

Modem heat sinks are usually made by aluminum extrusion method because of its relatively low cost of production. However, aluminum extrusion heat sink, which commonly includes a flat base and a plurality of fins extending upwardly from the base, has many drawbacks. The first drawback is that the total surface area of the fins available for heat dissipation is very limited as the made space between adjacent fins cannot be desirably small enough, and the ratio of the height of the fins to the space between adjacent fins is limited to a maximum value of 13:1. This drawback seriously bars improvement of the heat removal rate of the aluminum extrusion heat sinks. Another drawback is that the heat generated by heat sources cannot be rapidly transferred to an upper portion of the fins so that the upper portion of the fins has a relatively lower heat dissipation effect. This also limits heat dissipation efficiency of the heat sinks.

There is another kind of aluminum extrusion heat sink which includes a central post and a plurality of fins extending from the post. This kind of heat sink has a relatively large heat dissipating surface area because of incorporating more fins. However, the heat generated by heat sources still cannot be rapidly transferred to an upper portion of the heat sink, and the large heat dissipating surface area is therefore not efficiently used. Thus the heat dissipation effect of the heat sink is still not satisfactory. Taiwan Patent Issue No. 514488 shows an example of this kind of heat sink.

Therefore, it is desired to design a novel heat dissipating device to overcome the aforementioned problems and increase the heat dissipation effect thereof.

SUMMARY OF THE INVENTION

Accordingly, an object of the present invention is to provide a heat dissipating device having a large heat dissipating surface area which can be efficiently used.

In order to achieve the object set out above, a heat dissipating device for removing heat from heat-generating devices in accordance with the present invention comprises a heat sink and at least one heat pipe. The heat sink includes a heat conductive block and a plurality of fins extending from the block. The heat pipe is embedded in the block and comprises an evaporating portion attached to a bottom portion of the block and a condensing portion attached to an upper portion of the block, so that the heat pipe is capable of absorbing heat via the evaporating portion and transferring the heat to the upper portion of the block via the condensing portion.

Other objects, advantages and novel features of the present invention will become more apparent from the following detailed description when taken in conjunction with the accompanying drawings, in which:

DETAILED DESCRIPTION OF PREFERRED EMBODIMENTS

Figure 1:
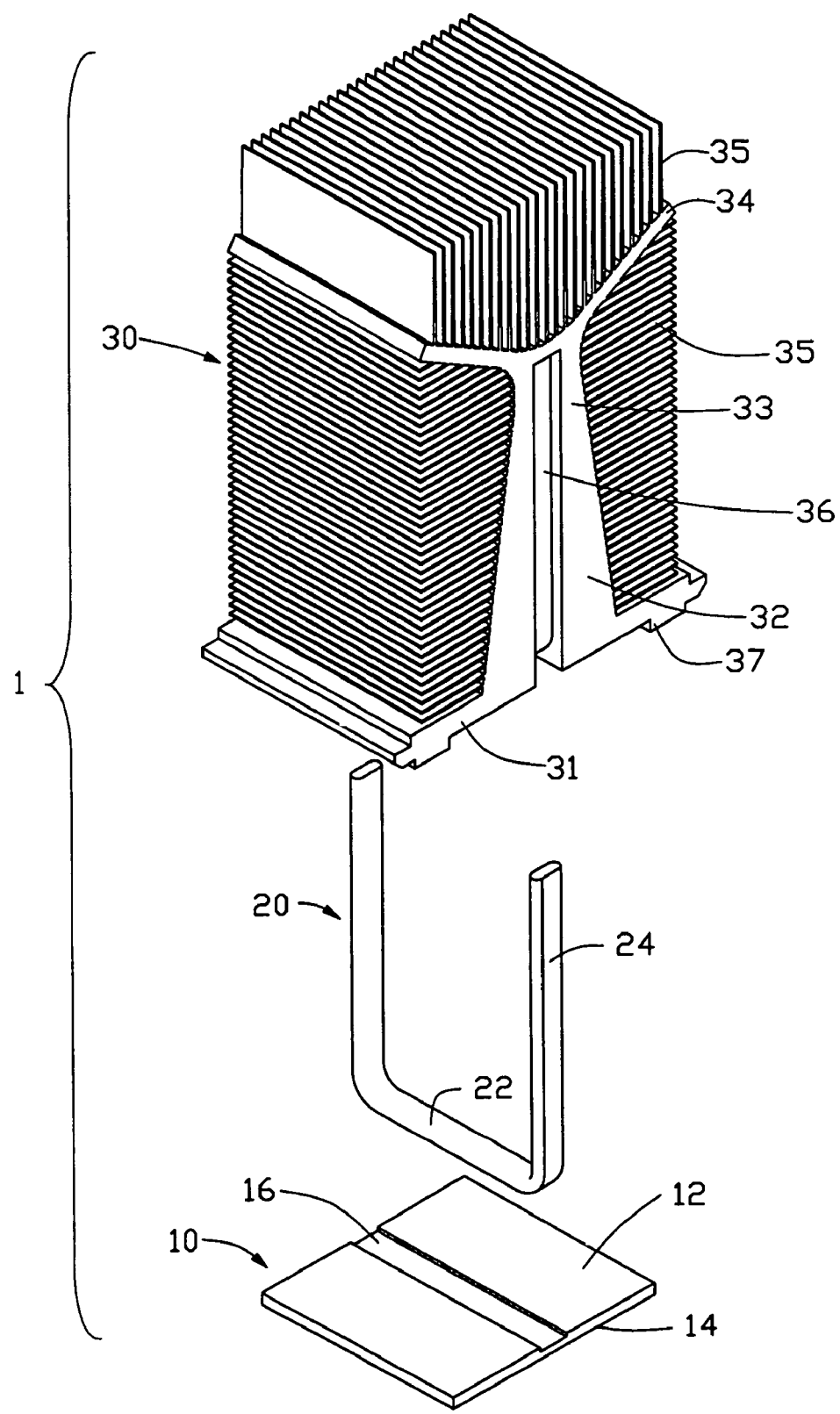
FIG. 1 is an exploded view of a heat dissipating device in accordance with one preferred embodiment of the present invention.

Reference will now be made to the drawing figures to describe the present invention in detail.

FIG. 1 illustrates a preferred embodiment of a heat dissipating device in accordance with present invention. The heat dissipating device 1 comprises a heat spreader 10, a U-shaped heat pipe 20 and a heat sink 30. The heat pipe 20 has a substantially rectangular cross-section, and includes a horizontal evaporating portion 22 and two vertical condensing portions 24 extending upwardly from two respective ends of the evaporating portion 22. The heat spreader 10 is preferably made of copper material and has a top surface 12 and an opposite bottom surface 14. The bottom surface 14 is adapted for absorbing heat from heat sources such as CPUs (not shown). The heat spreader 10 defines a groove 16 on the top surface 12 for partially receiving the evaporating portion 22 of the heat pipe 20 therein.

The heat sink 30 includes a base 31 and a solid heat conductive block 32 extending from the base 31. The block 32 has a transverse cross-section and the transverse size of the block 32 gradually decreases along an extending direction from which the block 32 extends from the base 31. Two opposite extension arms 34 extend outwardly and upwardly from a top of the block 32 respectively, so that the arms 34 and the block 32 cooperatively form a substantially Y-shaped heat conductive body. The heat sink 30 includes a plurality of fins 35, which includes horizontally extending fins extending outwardly from a pair of first opposing outer faces of the block 32 between the base 31 and the arms 34 and vertically extending fins extending upwardly from the arms 34. A groove 36 is continuously defined in the block 32. The groove 36 is substantially U-shaped, which is defined by traversing a bottom portion of the block 32 and extending to an upper portion 33 of the block 32 along a pair of second outer faces of the block 32 from which no fins 35 are provided. Two protrusions 37 projects downwardly from opposite two sides of the base 31 respectively. The heat sink 30 is preferably formed by extrusion method from aluminum material.

Figure 2:
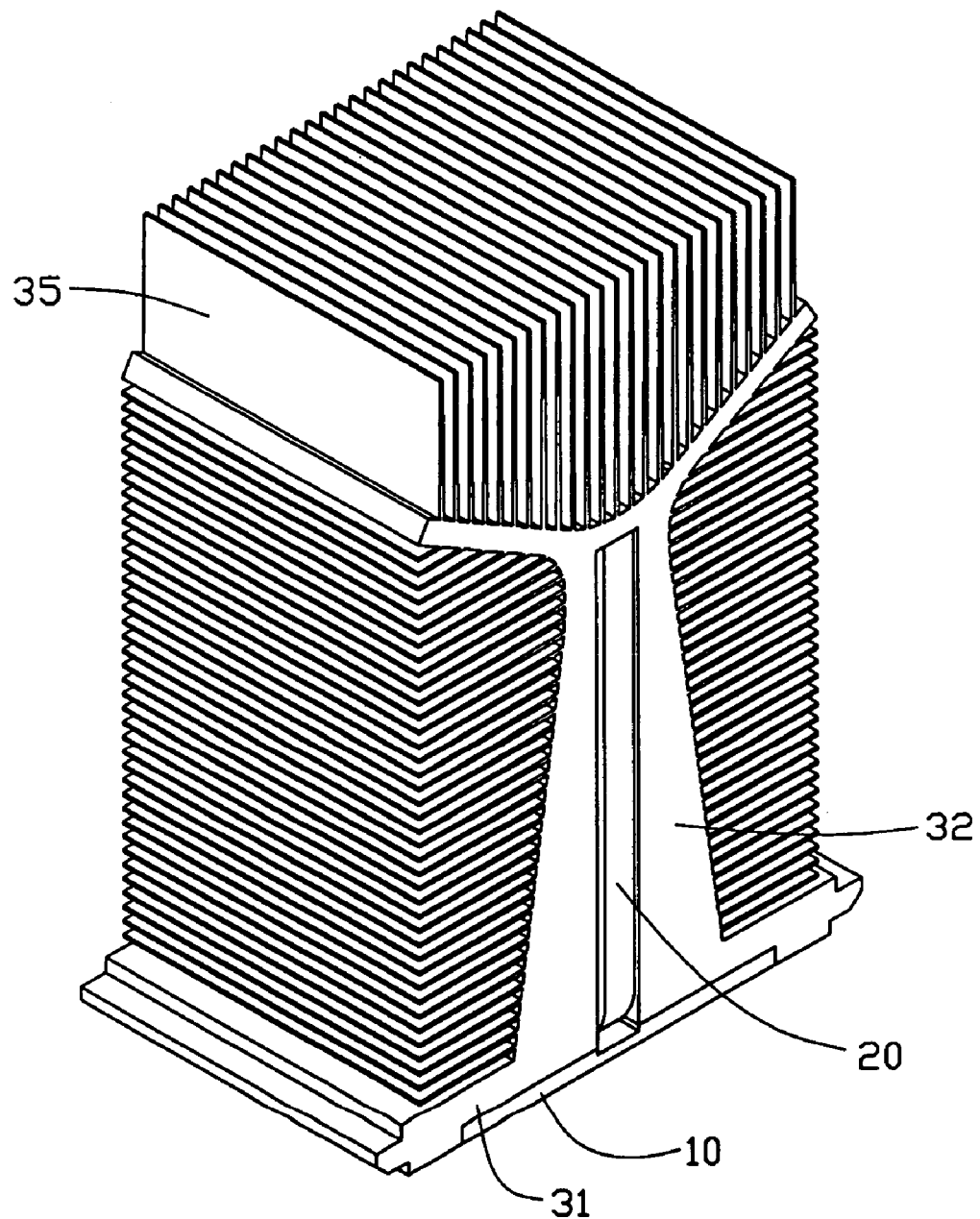
FIG. 2 is an assembled view of the heat dissipating device of FIG. 1.

Referring to FIG. 2, in assembly, the U-shaped heat pipe 20 is embedded in the U-shaped groove 36 so that the heat pipe 20 is attached to the heat sink 30. The heat spreader 10 is attached to the base 31 between the two protrusions 37, so that the evaporating portion 22 of the heat pipe 20 is sandwiched between the base 31 and the heat spreader 10 and partially received in the groove 16 of the heat spreader 10. The condensing portions 24 of the heat pipe 20 extend to the upper portion 33 of the block 32 so that the heat absorbed by the heat spreader 10 via the evaporating portion 22 can be rapidly transferred to the upper portion 33 of the block 32 via the condensing portions 24 and further transferred to the fins 35 located at the upper portion of the heat sink 30 in order for heat dissipation. Moreover, the base 31 absorbs the heat from the heat spreader 10 and then conducts the heat upwardly along the block 32. Preferably, a fan (not shown) can be used for improving heat dissipation effect of the heat sink 30. The heat dissipating device 1 of the present invention has a large heat dissipating surface area, and the heat can be rapidly transferred to the upper portion 37 of the heat sink 30 and the large heat dissipating surface area is efficiently used. Therefore the heat dissipating device 1 can achieve good heat dissipation effect.

Figure 3:
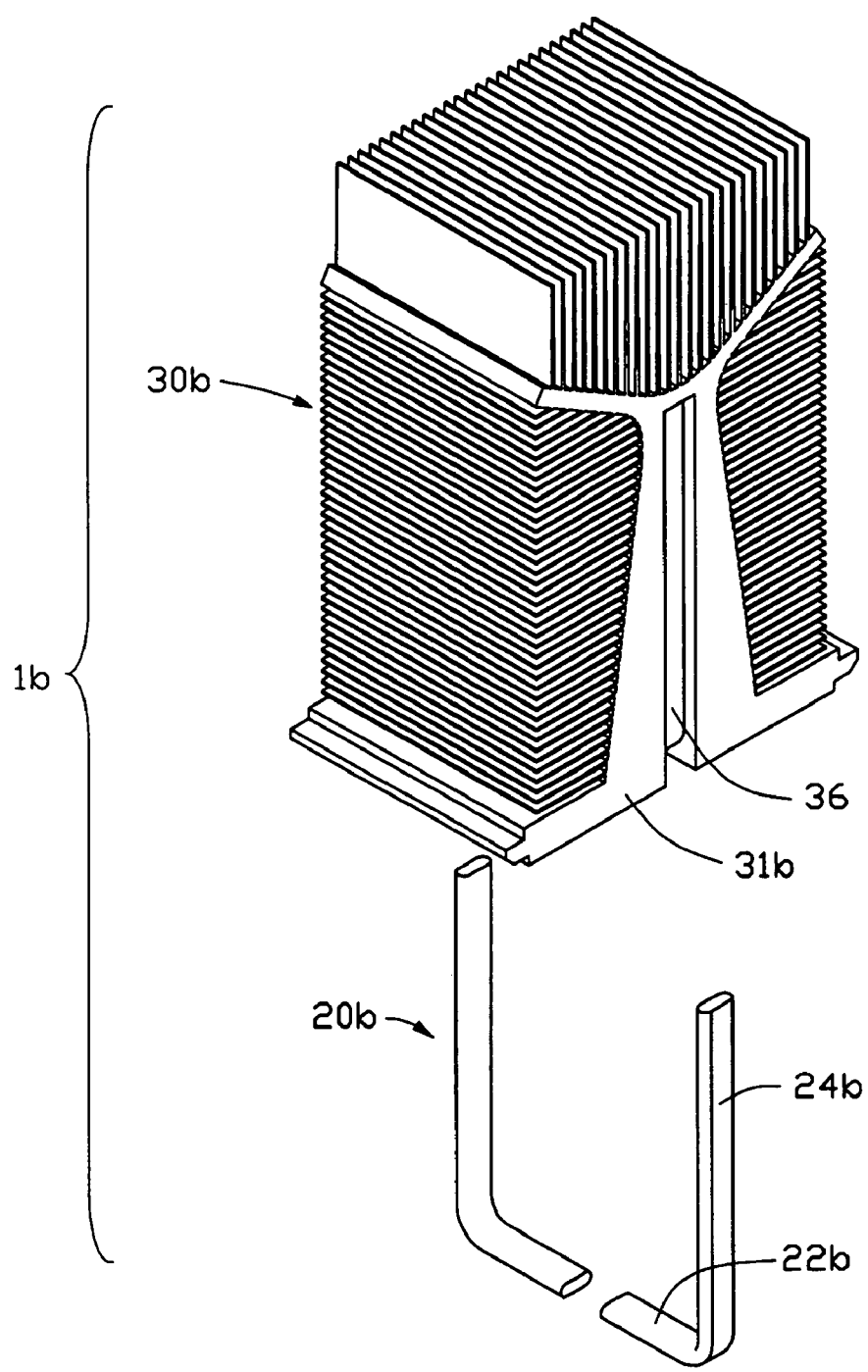
FIG. 3 is an exploded view of a heat dissipating device in accordance with another preferred embodiment of the present invention.

FIG. 3 illustrates a heat dissipating device 1b in accordance with another preferred embodiment of the present invention. The heat dissipating device 1b includes a heat sink 30b and two L-shaped heat pipes 20b. The heat sink 30b is similar to the heat sink 30 of the above-mentioned embodiment except the base 31. The heat sink 30b includes a base 31b without protrusions 37 formed therebelow for sandwiching a heat spreader. Each heat pipe 20b comprises a horizontal evaporating portion 22b and a vertical condensing portion 24b extending upwardly from one end of the evaporating portion 22b. The two heat pipes 20b are for being received in the groove 36 of the heat sink 30b from two opposite directions. The evaporating portions 22b of the heat pipes 20b, together with a bottom surface of the base 31b, are for contacting heat sources and absorbing heat therefrom directly.

Figure 4:
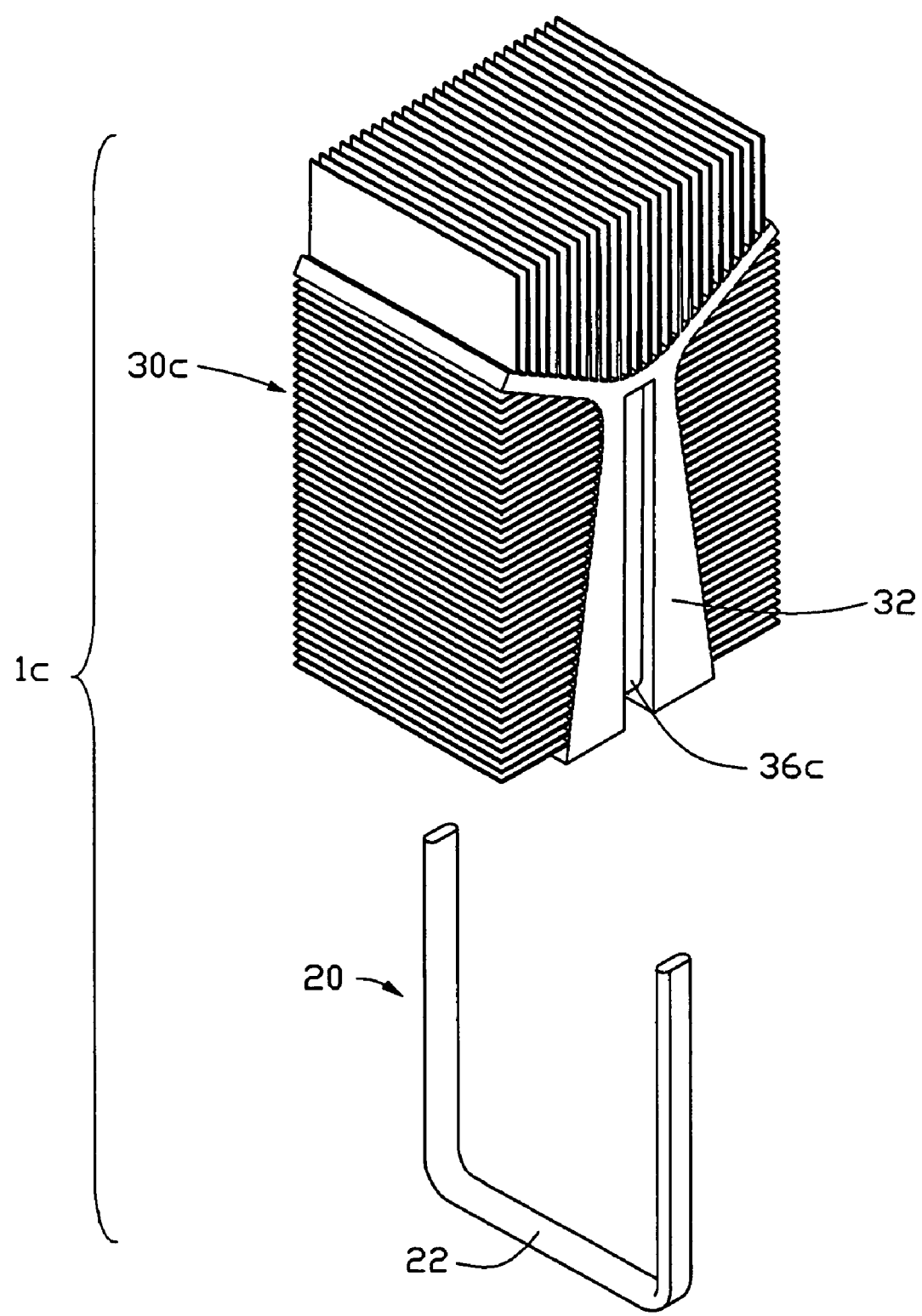
FIG. 4 is an exploded view of a heat dissipating device in accordance with a further preferred embodiment of the present invention.

FIG. 4 illustrates a heat dissipating device 1c in accordance with a further preferred embodiment of the present invention. The heat dissipating device 1c includes a heat sink 30c and a U-shaped heat pipe 20. The heat sink 30c is similar to the heat sink 30b except that the heat sink 30c has no base. The heat pipe 20 is for being received in a U-shaped groove 36c which is similar to the groove 36. The evaporating portion 22 of the heat pipe 20, together with the bottom of the block 32, is for contacting heat sources and absorbing heat therefrom directly.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A heat dissipating device comprising:
a heat sink comprising a heat conductive block and a plurality of fins extending from the block, the block having a transverse cross-section and the transverse size of the block gradually decreasing from a bottom portion to an upper portion of the block; and
at least one heat pipe embedded in the block and comprising a horizontal evaporating portion attached to the bottom portion of the block and a vertical condensing portion attached to the upper portion of the block, wherein said heat pipe is capable of absorbing heat via the evaporating portion and transfers the heat to the upper portion of the block.

2. The heat dissipating device of claim 1, wherein the heat sink further comprises two opposite arms outwardly and upwardly extending from a top of the block respectively, the fins horizontally extending from a pair of first opposing faces of the block and disposed between the bottom portion of the block and the arms.

3. The heat dissipating device of claim 2, further comprising a plurality of vertically extending fins extending upwardly from the arms.

4. The heat dissipating device of claim 2, wherein a substantially U-shaped first groove is continuously defined in the block to receive the heat pipe therein, said groove traversing a bottom surface of the block and extending to the upper portion of the block along a pair of second outer faces of the block.

5. The heat dissipating device of claim 4, further comprising a heat spreader attached to the bottom of the heat sink, the heat spreader defining a second groove to cooperatively receive the evaporating portion of the heat pipe therein together with the first groove of the block.

6. The heat dissipating device of claim 5, wherein the heat spreader is made of copper material.

7. The heat dissipating device of claim 4, wherein said heat pipe is substantially U-shaped.

8. The heat dissipating device of claim 4, wherein said heat pipe is substantially L-shaped.

9. A heat dissipating device comprising:
a heat sink comprising a heat conductive block and a plurality of fins extending from the block, said block defining a groove continuously along a bottom portion thereof and to an upper portion thereof along an outside of the block between the bottom portion and the upper portion, wherein the block has a transverse cross-section, and the transverse size of the block gradually decreases from the bottom portion to the upper portion thereof; and
at least one heat pipe received in said groove, said heat pipe comprising an evaporating portion attached to the bottom portion of the block and a condensing portion attached to the upper portion of the block whereby said heat pipe is capable of absorbing heat via the evaporating portion and transfers the heat to the upper portion of the block via the condensing portion.

10. The heat dissipating device of claim 9, wherein the fins extend from two opposite sides of the block.

11. The heat dissipating device of claim 9, wherein said heat pipe is substantially U-shaped.

12. The heat dissipating device of claim 9, wherein said heat pipe is substantially L-shaped.

13. The heat dissipating device of claim 9, wherein the heat sink further comprises two opposite arms outwardly and upwardly forming from a top of the block respectively, and a further plurality of fins extending upwardly from the arms.

14. A heat dissipating device comprising:
a body having a heat absorbing portion provided at a bottom portion thereof, the body defining a pair of first opposing outer faces and a pair of second opposing outer faces, both the first and second outer faces extending from the heat absorbing portion of the body;
a heat pipe comprising an evaporating portion attached to the heat absorbing portion of the body and a condensing portion embedded in the second outer faces of the body; and
a plurality of fins extending from the first outer faces of the body respectively.

15. The heat dissipating device of claim 14, wherein the body further comprises a pair of extension arms extending from opposite sides of a top portion thereof, the fins being horizontally disposed between the extension arms and the heat absorbing portion.

16. The heat dissipating device of claim 15, further comprising vertically extending fins extending upwardly from the arms.

17. The heat dissipating device of claim 16, wherein the body comprises a solid block.

18. The heat dissipating device of claim 14, wherein the first and second outer faces connect in serials to define a circumference of the body.

19. The heat dissipating device of claim 14, wherein the fins includes a first set of fins extending from one of the first outer faces and a second set of fins extending from the other of the first outer faces, and the first and second sets of fins extend away from each other in opposite directions.

* * * * *